(12) United States Patent
You et al.

(10) Patent No.: US 9,985,094 B2
(45) Date of Patent: May 29, 2018

(54) SUPER JUNCTION WITH AN ANGLED TRENCH, TRANSISTOR HAVING THE SUPER JUNCTION AND METHOD OF MAKING THE SAME

(71) Applicant: TAIWAN SEMICONDUCTOR MANUFACTURING COMPANY, LTD., Hsinchu (TW)

(72) Inventors: Jheng-Sheng You, Zhubei (TW); Che-Yi Lin, Hsinchu (TW); Shen-Ping Wang, Keelung (TW); Lieh-Chuan Chen, Hsinchu (TW); Chih-Heng Shen, Zhubei (TW); Po-Tao Chu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days. days.

(21) Appl. No.: 14/141,720

(22) Filed: Dec. 27, 2013

(65) Prior Publication Data

US 2015/0187872 A1    Jul. 2, 2015

(51) Int. Cl.
| | | |
|---|---|---|
| *H01L 29/66* | (2006.01) | |
| *H01L 21/36* | (2006.01) | |
| *H01L 29/06* | (2006.01) | |
| *H01L 29/78* | (2006.01) | |
| *H01L 29/40* | (2006.01) | |

(52) U.S. Cl.
CPC .... *H01L 29/0634* (2013.01); *H01L 29/66712* (2013.01); *H01L 29/78* (2013.01); *H01L 29/7802* (2013.01); *H01L 29/0649* (2013.01); *H01L 29/407* (2013.01)

(58) Field of Classification Search
CPC ........... H01L 29/7835; H01L 29/42368; H01L 29/66659; H01L 29/0847; H01L 29/402; H01L 29/0611; H01L 29/785; H01L 29/517; H01L 29/0619; H01L 29/0615; H01L 29/8083; H01L 27/098; H01L 29/808
USPC ........ 257/409, 213, 256, 134, 287, E51.005, 257/E27.148; 438/142, 140, FOR. 424, 438/FOR. 163, FOR. 178, FOR. 194
See application file for complete search history.

(56) References Cited

U.S. PATENT DOCUMENTS

| | | | | |
|---|---|---|---|---|
| 5,651,858 A | * | 7/1997 | Lin | ..................... H01L 21/3065 257/E21.218 |
| 6,861,702 B2 | * | 3/2005 | Kitamura | ............ H01L 29/0653 257/330 |

(Continued)

FOREIGN PATENT DOCUMENTS

CN        103413763 A  * 11/2013  .................... 257/330

*Primary Examiner* — Thao X Le
*Assistant Examiner* — Nduka Ojeh
(74) *Attorney, Agent, or Firm* — Hauptman Ham, LLP

(57) ABSTRACT

A super junction includes a substrate and an epitaxial layer over the substrate, the epitaxial layer having a first dopant type. The super junction further includes an angled trench in the epitaxial layer, the angled trench having sidewalls disposed at an angle ranging from about 85-degrees to about 89-degrees with respect to a top surface of the epitaxial layer. The super junction further includes a doped body in the epitaxial layer surrounding the angled trench, the doped body having a second dopant type, the second dopant type opposite that of the first dopant type.

20 Claims, 14 Drawing Sheets

(56) References Cited

U.S. PATENT DOCUMENTS

| | | | |
|---|---|---|---|
| 8,114,751 B2 | 2/2012 | Ishiguro et al. | |
| 2001/0055861 A1* | 12/2001 | Patti | H01L 21/82348 438/524 |
| 2002/0070418 A1* | 6/2002 | Kinzer | H01L 29/0634 257/496 |
| 2002/0117715 A1* | 8/2002 | Oppermann | H01L 29/0634 257/339 |
| 2002/0171093 A1* | 11/2002 | Onishi | H01L 29/0634 257/197 |
| 2004/0014451 A1* | 1/2004 | Sapp | H01L 29/0634 455/335 |
| 2005/0258454 A1* | 11/2005 | Kumar et al. | 257/211 |
| 2010/0314659 A1* | 12/2010 | Yilmaz et al. | 257/139 |
| 2010/0314682 A1* | 12/2010 | Yilmaz et al. | 257/328 |
| 2011/0198689 A1* | 8/2011 | Kim | H01L 29/0634 257/331 |
| 2011/0298042 A1* | 12/2011 | Tu | 257/330 |
| 2014/0027841 A1* | 1/2014 | Bhalla | H01L 29/0696 257/330 |
| 2016/0027874 A1* | 1/2016 | You | H01L 29/66712 257/329 |

\* cited by examiner

SUPER JUNCTION WITH AN ANGLED TRENCH, TRANSISTOR HAVING THE SUPER JUNCTION AND METHOD OF MAKING THE SAME

BACKGROUND

A super junction is a region of alternating conductivity types in a substrate. Super junctions are used to reduce a resistance of a transistor during an "on" state. Super junctions also help to increase breakdown voltage in comparison with transistors which do not include super junctions.

In some approaches, the super junction is formed using a straight walled trench opening in a doped substrate. The straight walled trench has sidewalls which extend perpendicular to a top surface of the substrate. The trench opening is then filled by one or more epitaxial depositions in order to form the alternating conductivity type regions. In some approaches, the trench openings are subjected to a tilted ion implantation process to introduce a dopant species opposite to that of the doped substrate.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion. The drawings, incorporated herein by reference, include the following.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
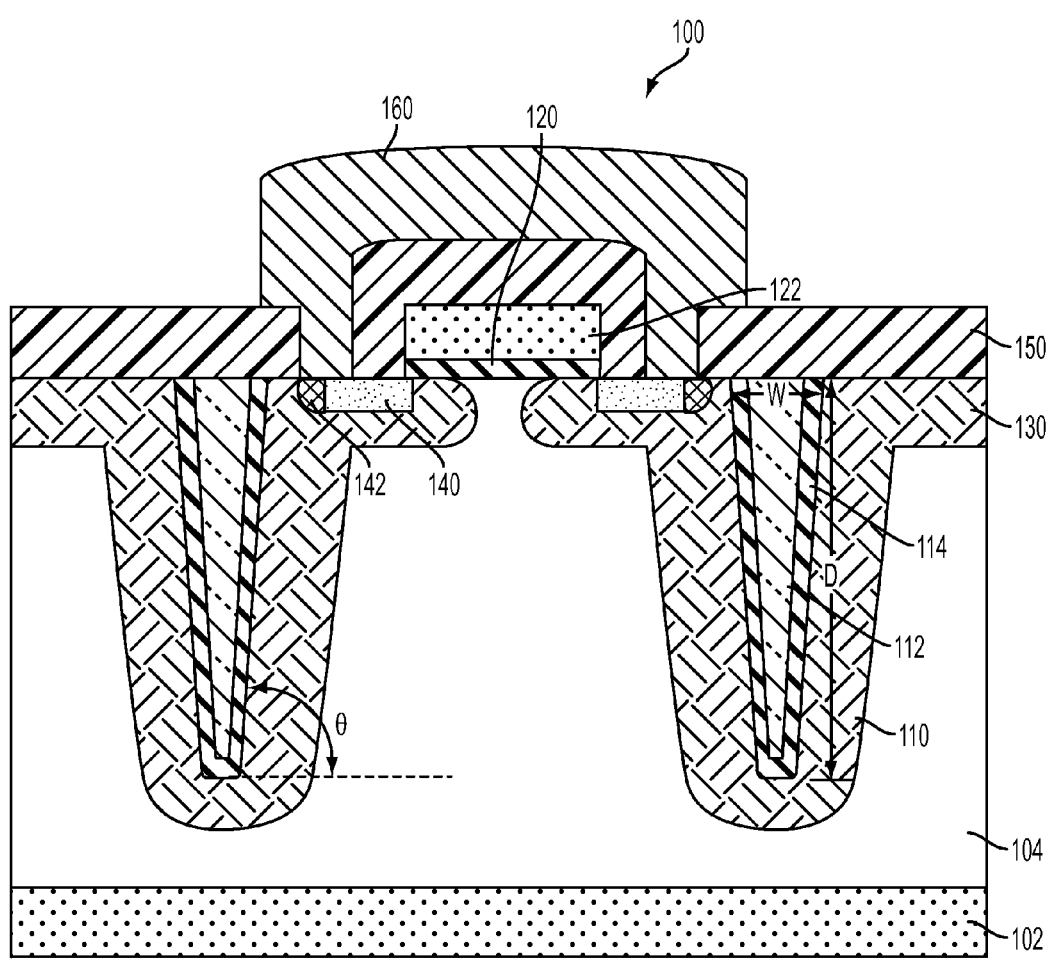
FIG. 1 is a cross sectional view of a transistor having a super junction in accordance with one or more embodiments.

FIG. 1 is a cross sectional view of a transistor 100 having a super junction in accordance with one or more embodiments. Transistor 100 includes a doped substrate 102 having a first dopant type. An epitaxial layer 104 is over doped substrate 102. Epitaxial layer 104 also has the first dopant type. A doped body 110 having a second dopant type, opposite the first dopant type, is formed in epitaxial layer 104. Doped body 110 surrounds an angled trench filled with a fill material 112. An insulating material 114 is also in the angled trench between doped body 110 and fill material 112. The angled trench has sidewalls which are angled with respect to a top surface of epitaxial layer 104. The sidewalls have an angle θ ranging from about 85-degrees to about 89-degrees with respect to the top surface of epitaxial layer 104. Epitaxial layer 104, doped body 110, fill material 112 and insulating material 114 together form the super junction for transistor 100.

Transistor 100 further includes a gate dielectric layer 120 over epitaxial layer 104. A gate electrode layer 122 is over gate dielectric layer 120. A surface doped region 130 is in epitaxial layer 104 and is continuous with doped body 110. Surface doped region 130 has the second dopant type. A first heavily doped region 140 is in surface doped region 130 and has the first dopant type. A dopant concentration in first heavily doped region 140 is higher than a dopant concentration in epitaxial layer 104. A second heavily doped region 142 is in surface doped region 130 and has the second dopant type. Second heavily doped region 142 contacts first heavily doped region 140. A dopant concentration in second heavily doped region 142 is higher than a dopant concentration in surface doped region 130. Transistor 100 further includes an inter-layer dielectric (ILD) 150 over epitaxial layer 104. ILD 150 exposes a location where second heavily doped region 142 contacts first heavily doped region 140. ILD 150 covers a top surface of gate electrode layer 122, as well as sidewalls of gate electrode layer 122 and sidewalls of gate dielectric layer 120. A conductive layer 160 is over a portion of ILD 150 over gate electrode layer 122 and electrically connects with the location where second heavily doped region 142 contacts first heavily doped region 140.

Doped substrate 102 is used to provide mechanical support and a conductive path for the super junction. In some embodiments, doped substrate 102 is an n-doped substrate. In some embodiments, the dopant includes arsenic, phosphorous, or another suitable n-type dopant. In some embodiments, doped substrate 102 is a heavily doped substrate. In some embodiments, a dopant concentration of doped substrate 102 is greater than the dopant concentration of first heavily doped region 140. In some embodiments, doped substrate 102 includes an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, doped substrate 102 is a strained SiGe substrate. In some embodiments, the semiconductor substrate has a semiconductor on insulator structure, such as a silicon on insulator (SOI) structure. In some embodiments, the compound semiconductor substrate has a multilayer structure, or the substrate includes a multilayer compound semiconductor structure.

Epitaxial layer 104 is used to help form the super junction. In some embodiments, epitaxial layer 104 is an n-doped epitaxial (n-epi) layer. In some embodiments, epitaxial layer 104 includes silicon, germanium or another suitable semiconductor material. In some embodiments, a dopant in epitaxial layer 104 is a same dopant as the dopant in doped substrate 102. In some embodiments, the dopant in epitaxial layer 104 is different from the dopant in doped substrate 102. In some embodiments, epitaxial layer 104 has a thickness ranging from about 10 microns (μm) to about 80 μm. In some embodiments, a dopant concentration of epitaxial layer 104 is sufficient to produce a resistance in the epitaxial layer ranging from about 0.1 ohm-cm to about 10 ohm-cm.

Doped body 110 is used in combination with epitaxial layer 104 to form the alternating conductive structures of the super junction. Doped body 110 surrounds the angled trench. Doped body 110 is uniformly distributed along sidewalls and across a bottom surface of the angled trench. In some embodiments, doped body 110 includes p-type dopants and is called a P-column. In some embodiments, a dopant in doped body 110 includes boron, boron difluoride or another suitable p-type dopant. In some embodiments, doped body 110 has a dopant concentration ranging from about $10^{15}$ ions/cm$^3$ to about $10^{18}$ ions/cm$^3$.

Fill material 112 fills the angled trench. In some embodiments, fill material 112 includes a conductive material such as polysilicon, a metal or another suitable conductive material. In some embodiments, fill material 112 includes a dielectric material such as silicon oxide, a silicon nitride, silicon carbide, silicon oxynitride, un-doped polysilicon or another suitable dielectric material. In some embodiments, fill material 112 is an air gap, i.e., a void.

Insulating material 114 provides electrical insulation between doped body 110 and fill material 112. In some embodiments, insulating material 114 includes silicon dioxide, aerogel, silicon nitride, silicon carbide, silicon oxynitride or another suitable insulating material. In some embodiments, a material of insulating material 114 is a same material as fill material 112. In some embodiments, the material of insulating material 114 is different from the material of fill material 112. In some embodiments where fill material 112 includes a dielectric material, insulating material 114 is omitted.

Gate dielectric layer 120 is used to help form a gate structure for transistor 100. In some embodiments, gate dielectric layer 120 includes silicon dioxide. In some embodiments, gate dielectric layer 120 includes a high-k dielectric material. A high-k dielectric material has a dielectric constant (k) higher than the dielectric constant of silicon dioxide. In some embodiments, k is greater than 3.9. In some embodiments, k is greater than 8.0. In some embodiments, gate dielectric layer 120 has a thickness ranging from about 200 angstroms (Å) to about 3000 Å.

Gate electrode layer 122 is used to help form the gate structure for transistor 100. In some embodiments, gate electrode layer 122 includes polysilicon, a metal or another suitable conductive material. In some embodiments, a work function layer is between gate dielectric layer 120 and gate electrode layer 122. In some embodiments, a thickness of gate electrode layer 122 is greater than about 3000 Å.

Surface doped region 130 is used to help form a channel for transistor 100. In some embodiments, surface doped region 130 extends below gate dielectric layer 120. In some embodiments, surface doped region 130 is continuous with doped body 110. In some embodiments, surface doped region 130 includes a p-type dopant. In some embodiments, the p-type dopant includes boron, boron difluoride or other suitable p-type dopant. In some embodiments, a dopant in surface doped region 130 is the same as the dopant in doped body 110. In some embodiments, the dopant in surface doped region 130 is different from the dopant in doped body 110. In some embodiments, surface doped region 130 has a dopant concentration ranging from about $10^{15}$ ions/cm$^3$ to about $10^{18}$ ions/cm$^3$. In some embodiments, surface doped region 130 includes a same dopant concentration as doped body 110. In some embodiments, surface doped region 130 has a different dopant concentration from doped body 110.

First heavily doped region 140 is part of a source or drain of transistor 100. First heavily doped region 140 is in surface doped region 130. In some embodiments, first heavily doped region extends underneath gate dielectric layer 120. In some embodiments, a periphery of first heavily doped region 140 is outside a boundary of gate dielectric layer 120. In some embodiments, first heavily doped region 140 includes an n-type dopant. In some embodiments, a dopant in first heavily doped region 140 is the same as in epitaxial layer 104 or doped substrate 102. In some embodiments, the dopant in first heavily doped region 140 differs from the dopant in epitaxial layer 104 or substrate 102. In some embodiments, a dopant concentration of first heavily doped region 140 ranges from about $10^{17}$ ions/cm$^3$ to about $10^{20}$ ions/cm$^3$. The dopant concentration of first heavily doped region 140 is greater than the dopant concentration of epitaxial layer 104.

Second heavily doped region 142 is also part of the source or drain of transistor 100. Second heavily doped region 142 contacts first heavily doped region 140 in surface doped region 130. In some embodiments, second heavily doped region 142 includes a p-type dopant. In some embodiments, the p-type dopant includes boron, boron difluoride or another suitable p-type dopant. In some embodiments, a dopant in second heavily doped region 142 is the same as in doped body 110 or surface doped region 130. In some embodiments, the dopant in second heavily doped region 142 differs from the dopant in doped boy 110 or surface doped region 130. In some embodiments, a dopant concentration of second heavily doped region 142 ranges from about $10^{17}$ ions/cm$^3$ to about $10^{20}$ ions/cm$^3$. The dopant concentration of second heavily doped region 142 is greater than the dopant concentration of doped body 110 or surface doped region 130.

ILD 150 provides insulating material between gate electrode layer 122 and conductive layer 160. ILD 150 also provides insulating material between additional contacts and first heavily doped region 140 and second heavily doped region 142. ILD 150 helps to insulate the super junction from other electrical components in a device which includes transistor 100. ILD 150 includes a dielectric material. In some embodiments, the dielectric material includes silicon oxide, silicon nitride, silicon carbide, silicon oxynitride or another suitable dielectric material. In some embodiments, ILD 150 includes a same material as fill material 112 or insulating material 114. In some embodiments, ILD 150 includes a different material from fill material 112 or insulating material 114.

Conductive layer 160 provides electrical connection to the location at which first heavily doped region 140 contacts second heavily doped region 142, i.e., the source and drain of transistor 100. In some embodiments, conductive layer 160 includes polysilicon, metal, or another suitable conductive material.

In comparison with other approaches which do not include the angled trench, doped body 110 has a higher degree of uniformity of dopant concentration. The angled trench has sidewalls which are at angle θ ranging from about 85-degrees to about 89-degrees. The angled trench helps with providing more even distribution of dopants in a portion of doped body 110 farthest from the top surface of epitaxial layer 104. The increased distribution uniformity enables increased depth of the angled trench. The increased depth in turn increases a break down voltage of transistor 100 in comparison with other approaches. For example, a depth D of the angled trench being about 10 μm results in a break down voltage of about 145 volts (V). In another example, depth D of the angled trench of about 20 μm results in the break down voltage being about 209 V. In some embodiments, an aspect ratio W/D of the angled trench ranges from about 1.5/50 to about 5/50. In addition, fill material 112 and insulating material 114 are able to be formed using a lower cost and faster process than filling a non-angled trench with one or more epitaxial materials.

In some embodiments, transistor 100 is a high voltage transistor. In some embodiments, transistor 100 is a high voltage metal oxide semiconductor (HVMOS) transistor. In some embodiments, transistor 100 is used as a power device to selectively connect a semiconductor device to a power supply. In some embodiments, transistor 100 is an input/output (I/O) device.

Figure 2A:
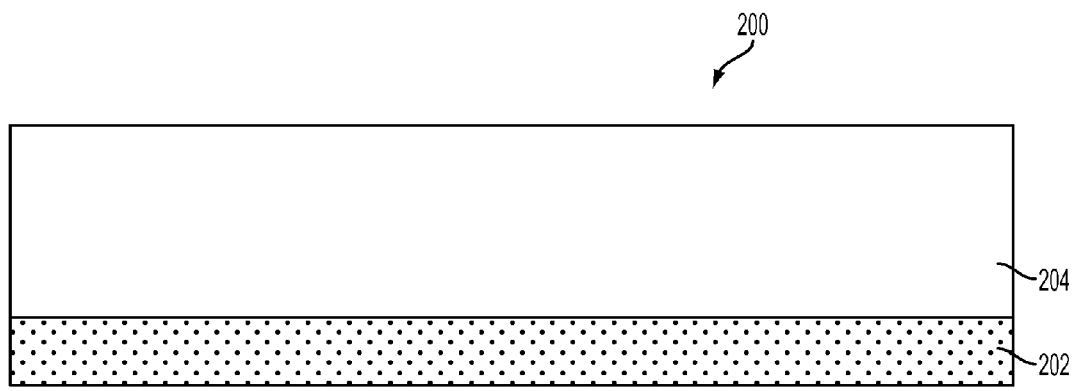
FIGS. 2A-2N are cross sectional views of a transistor having a super junction during various stages of production in accordance with one or more embodiments.

FIG. 2A is a cross sectional view of a transistor 200 having a super junction following formation of an epitaxial layer 204 in accordance with one or more embodiments. Transistor 200 is similar to transistor 100 (FIG. 1). Similar elements have a same reference number increased by 100. Epitaxial layer 204 is formed over doped substrate 202 using an epitaxial process. In some embodiments, epitaxial layer 204 is doped by introducing dopants during the formation of the epitaxial layer. In some embodiments, epitaxial layer 204 is doped by a separate process following formation of the epitaxial layer. In some embodiments, epitaxial layer 204 is formed to have a thickness ranging from about 10 µm to about 80 µm. In some embodiments, a dopant concentration in epitaxial layer 204 is sufficient to result in a resistance ranging from about 0.1 ohm-cm to about 10 ohm-cm.

Figure 2B:
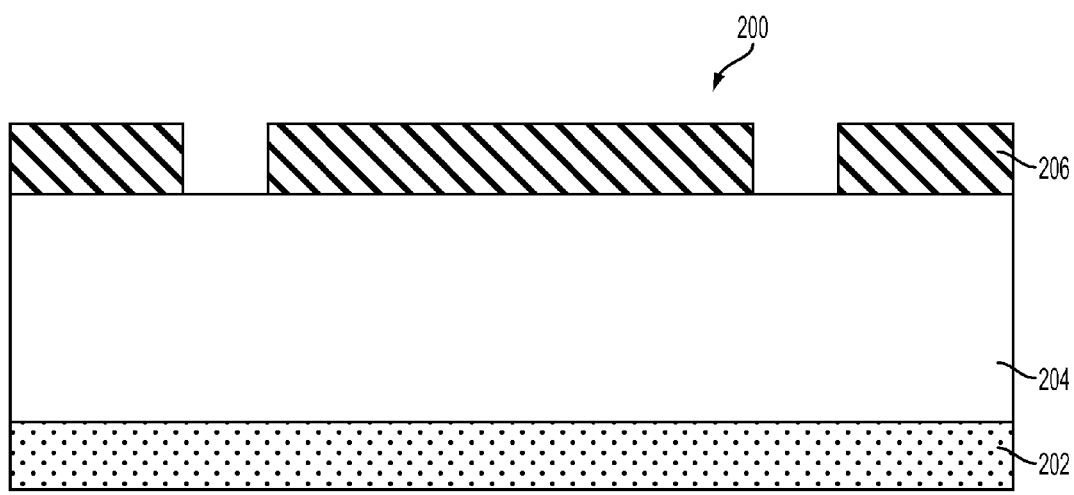

FIG. 2B is a cross sectional view of transistor 200 following formation and patterning of a hard mask layer 206 in accordance with one or more embodiments. In some embodiments, hard mask layer 206 is formed by a chemical vapor deposition (CVD) process, a physical vapor deposition (PVD) process, spin-on coating, or another suitable formation process. In some embodiments, hard mask layer 206 includes silicon dioxide, a silicon nitride or another suitable masking material. In some embodiments, hard mask layer 206 has a thickness ranging from about 5000 Å to about 25,000 Å. Hard mask layer 206 is patterned to expose a portion of epitaxial layer 204 for forming angled trenches. A width of the exposed portion of epitaxial layer 204 is selected based on a depth of the angled trench as well as an angle between sidewalls of the angled trench and the top surface of epitaxial layer 204. In some embodiments, hard mask layer 206 is etched using a photolithography/etching process, a laser drilling process or another suitable material removal process.

Figure 2C:
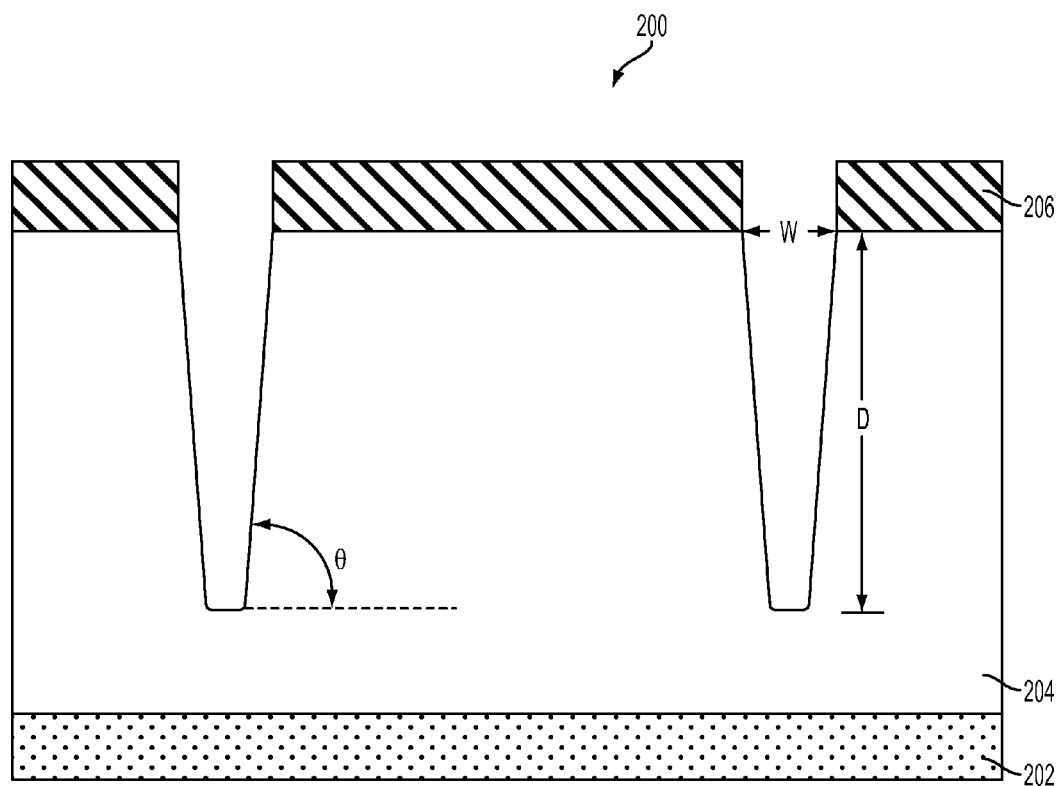

FIG. 2C is a cross sectional view of transistor 200 following formation of the angled trench in accordance with one or more embodiments. The angled trench is formed by etching epitaxial layer 204 through hard mask layer 206. In some embodiments, the etching process is a dry etching process. In some embodiments, the etchants include carbon fluorides ($C_xF_y$), sulfur hexafluoride ($SF_6$), oxygen gas ($O_2$), carbon chlorides ($C_xCl_y$), argon (Ar) or another suitable etchant material. In some embodiments, an aspect ratio W/D of the angled trench ranges from about 1.5/50 to about 5/50. In some embodiments, an angle between sidewalls of the angled trench and a top surface of epitaxial layer 204 ranges from about 85-degrees to about 89-degrees. In some embodiments, the depth of the angled trench ranges from about 8 µm to about 50 µm.

Figure 2D:
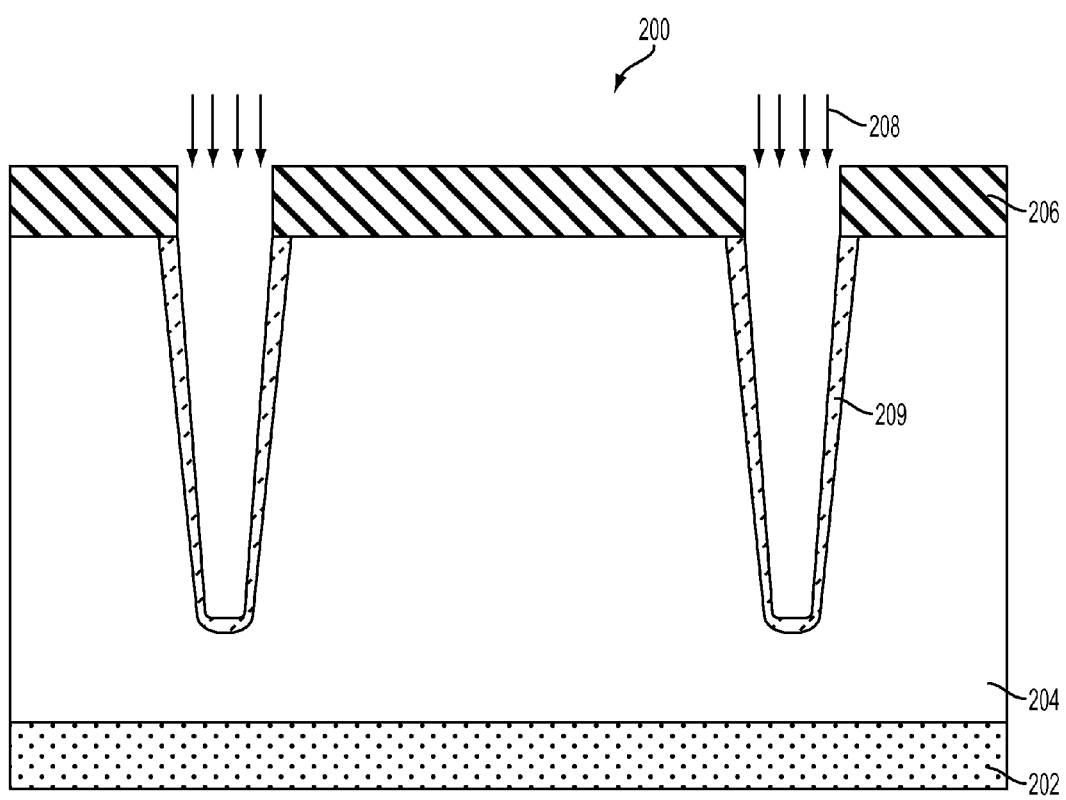

FIG. 2D is a cross sectional view of transistor 200 following a vertical ion implantation 208 in accordance with one or more embodiments. Vertical ion implantation 208 deposits dopants 209 into the angled trench. In comparison with tilt implantation processes performed on perpendicular sidewalls, vertical ion implantation 208 combined with the angled sidewalls of the angled trench provide a more uniform distribution of dopants 209 along the angled trench. Vertical ion implantation 208 also enables a deeper angled trench in comparison with tilted ion implantation processes. The deeper angled trench increases a breakdown voltage of transistor 200. In some embodiments, vertical ion implantation 208 deposits a p-type dopant into epitaxial layer 204. In some embodiments, the p-type dopant includes boron, boron difluoride, or another suitable p-type dopant. In some embodiments, a dopant concentration of dopants 209 ranges from about $10^{15}$ ions/cm$^3$ to about $10^{18}$ ions/cm$^3$.

Following vertical ion implantation 208, hard mask layer 206 is removed. In some embodiments, hard mask layer 206 is removed using an etching process, a planarization process, or another suitable material removal process.

Figure 2E:
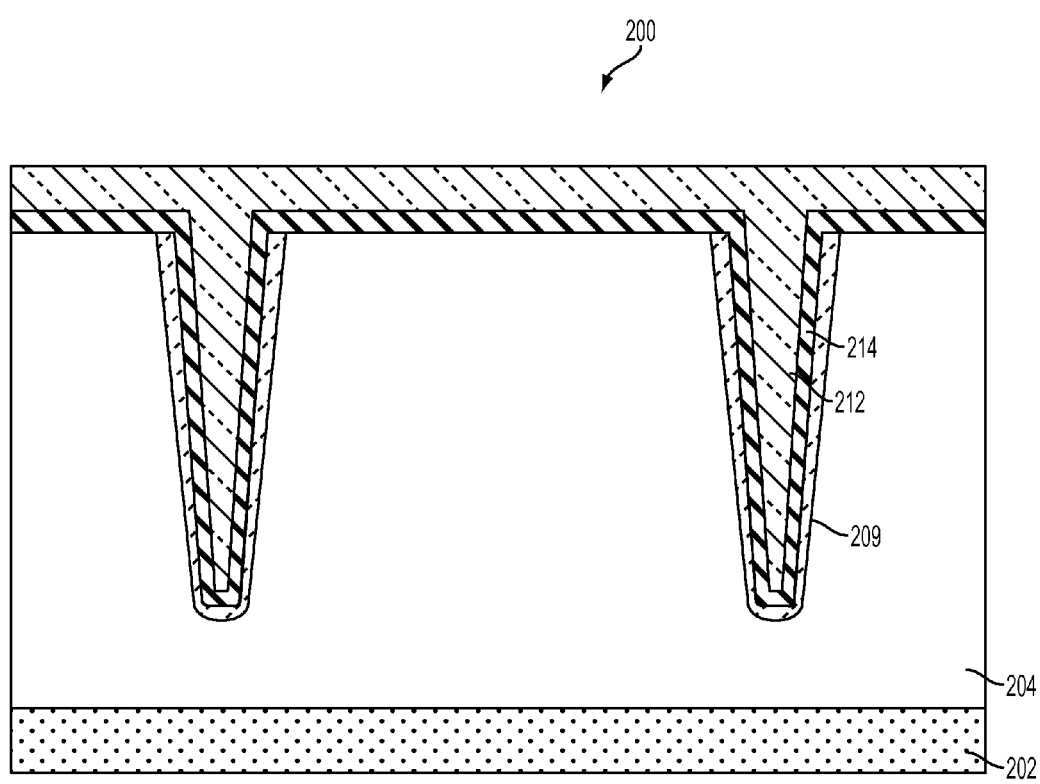

FIG. 2E is a cross sectional view of transistor 200 following formation of insulating layer 214 and fill material 212 in accordance with one or more embodiments. In some embodiments, insulating layer 214 is omitted. In some embodiments, insulating layer 214 is formed prior to the formation of fill material 212. In some embodiments, insulating layer 214 includes silicon dioxide, aerogel or another suitable insulating material. In some embodiments, insulating layer 214 is blanket deposited using a CVD process, a PVD process, an atomic layer deposition (ALD) process, a spin-on process or another suitable formation process. In some embodiments, fill material 212 fills a portion of the angled trench not filled by insulating material 214. In some embodiments, fill material 212 includes a conductive material such as polysilicon or another suitable conductive material. In some embodiments, fill material 212 includes a dielectric material such as silicon dioxide, a silicon nitride or another suitable dielectric material. In some embodiments, fill material 212 is an air gap. In some embodiments, a material of insulating material 214 is a same material as fill material 212. In some embodiments, the material of insulating material 214 is different from the material of fill material 212. In some embodiments, fill material 212 is formed by blanket depositing the fill material using a CVD process, a PVD process, an ALD process, a spin-on coating process or another formation process. In some embodiments, fill material 212 is formed using a same process as insulating material 214. In some embodiments, fill material 212 is formed using a different process from insulating material 214. In some embodiments, fill material 212 and insulating material 214 are formed simultaneously.

Figure 2F:
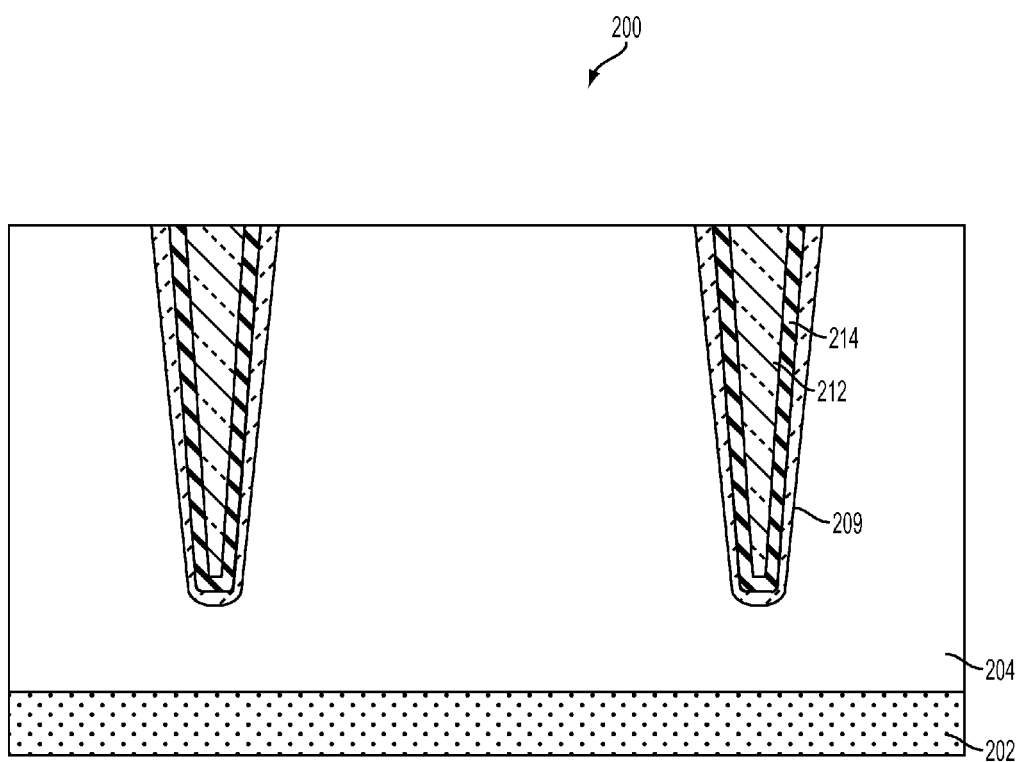

FIG. 2F is a cross sectional view of transistor 200 following a planarization process in accordance with one or more embodiments. In some embodiments, the planarization process includes a chemical mechanical polishing (CMP) process, a grinding process, an etching process or another suitable material removal process. The planarization process removes portions of fill material 212 and insulating material 214 outside the angled trenches. Following the planarization process, a top surface of fill material 212 and a top surface of insulating material 214 are coplanar with a top surface of epitaxial layer 204, in some embodiments.

Figure 2G:
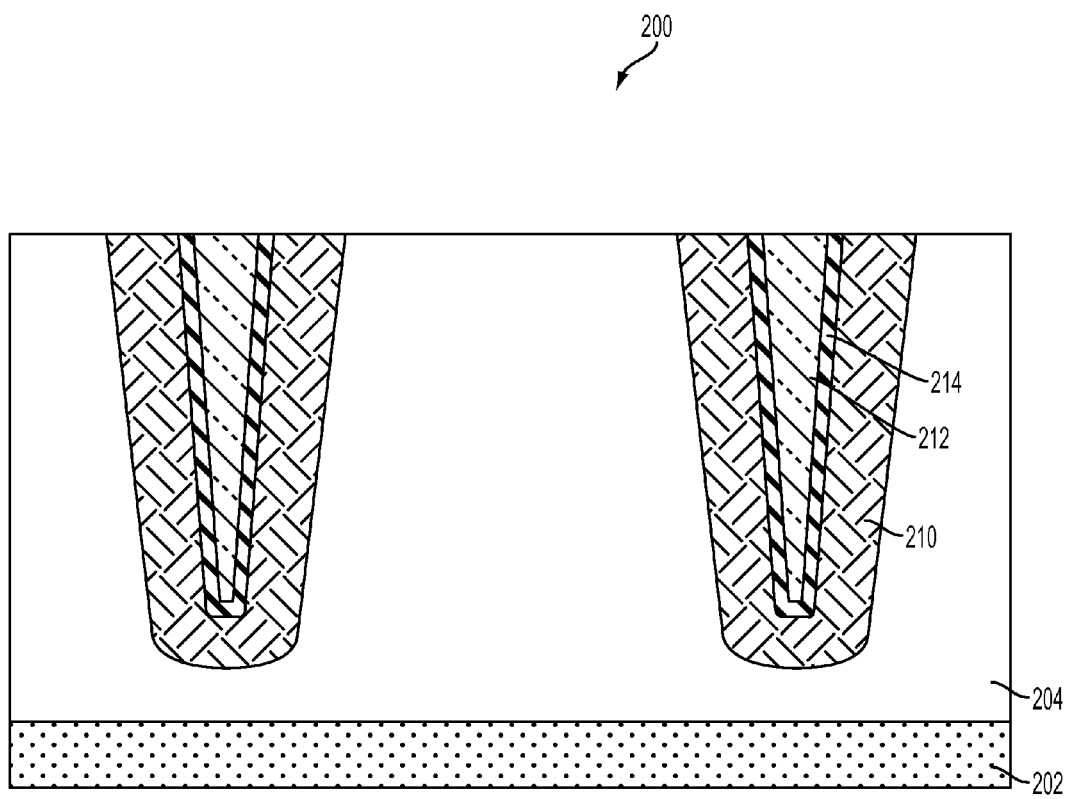

FIG. 2G is a cross sectional view of transistor 200 following a first thermal process in accordance with one or more embodiments. The first thermal process is used to diffuse dopants 209 to form doped body 210 into epitaxial layer 204. The first thermal process causes dopants 209 to diffuse from the original location at a sidewall surface of the angled trench farther into epitaxial layer 204 to form doped body 210. In some embodiments, the first thermal process includes heating transistor 200 at a temperature ranging from about 1000° C. to about 1250° C. In some embodiments, the first thermal process has a duration ranging from about 30 minutes to about 300 minutes. In some embodiments, the first thermal process is an annealing process. In some embodiments, the first thermal process is conducted in an inert environment. In some embodiments, the first thermal process is conducted in an environment containing reducing agents.

Figure 2H:
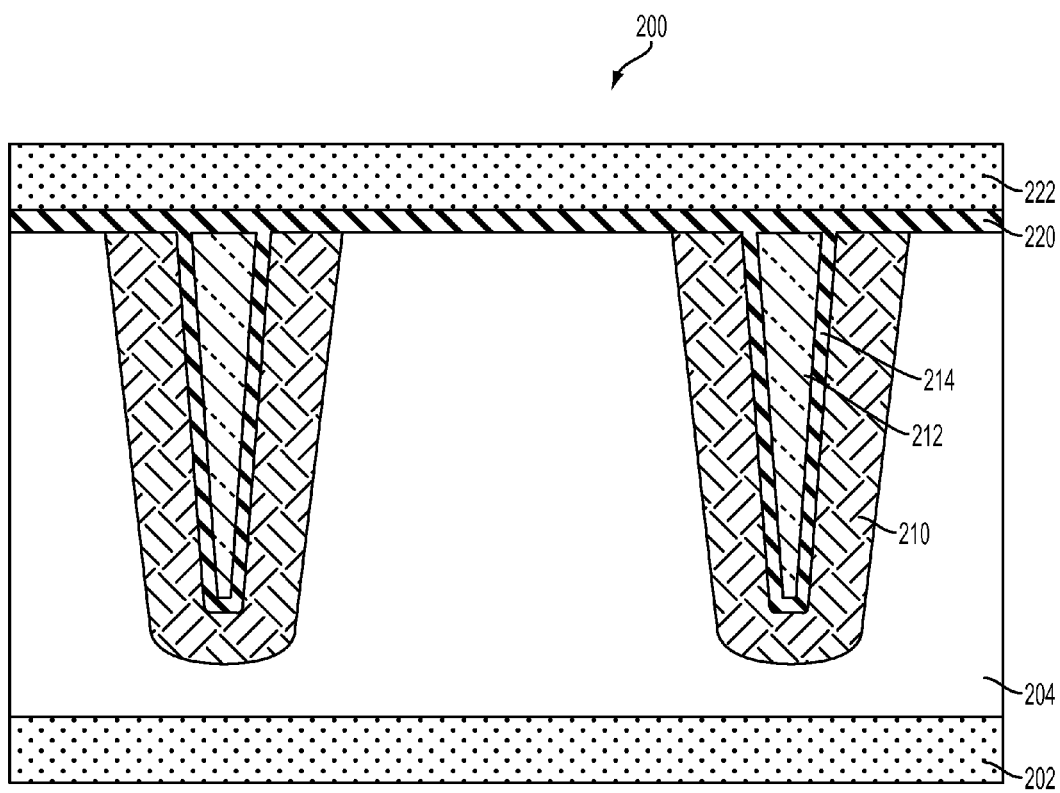

FIG. 2H is a cross sectional view of transistor 200 following formation of gate dielectric layer 220 and gate electrode layer 222 in accordance with one or more embodiments. In some embodiments, gate dielectric layer 220 is blanket deposited using a PVD process, a CVD process, a spin-on coating process, a thermal dry oxidation, a thermal wet oxidation or another formation process. In some embodiments, gate electrode layer 222 is blanket deposited using a PVD process, a CVD process, an ALD process, a plating process, a spin-on coating process or another suitable formation process. In some embodiments, a process used to form gate dielectric layer 220 is a same process used to form gate electrode layer 222. In some embodiments, a process used to form gate dielectric layer 220 is a different process from the process for forming gate electrode layer 222.

Figure 2I:
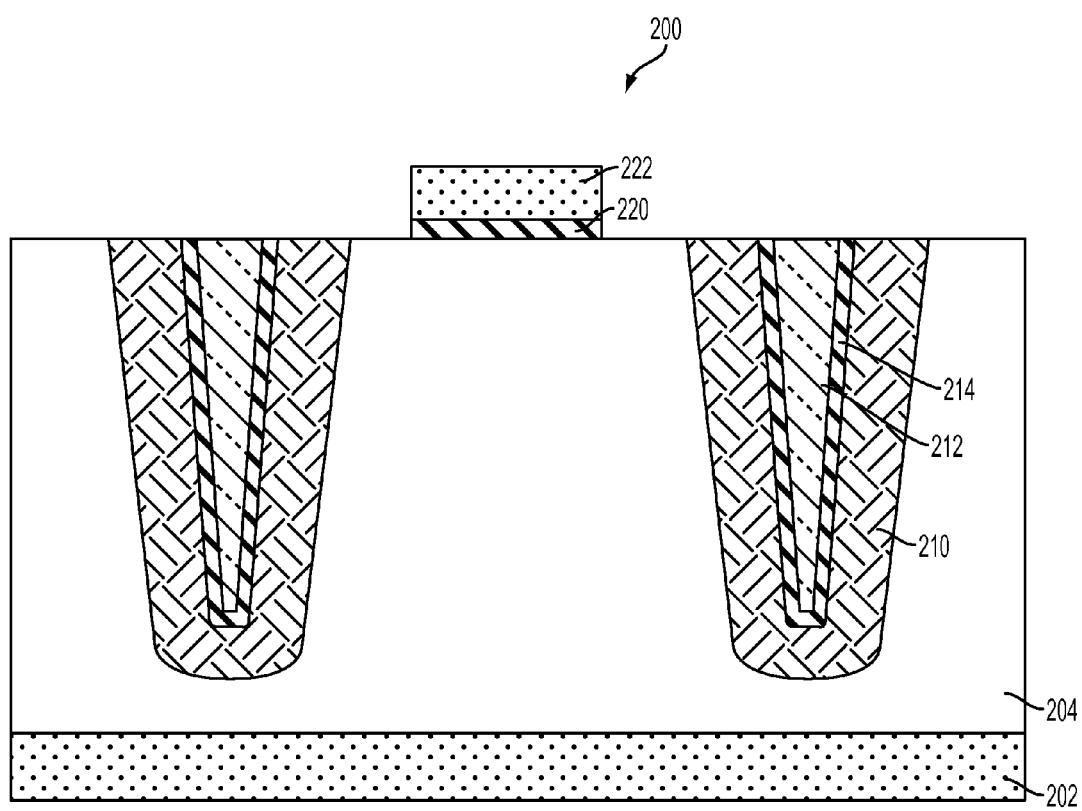

FIG. 2I is a cross sectional view of transistor 200 following patterning of gate dielectric layer 220 and gate electrode layer 222 in accordance with one or more embodiments. In some embodiments, the patterning process is an etching process or another suitable material removal process. In some embodiments, gate dielectric layer 220 is patterned in a same process as gate electrode layer 222. In some embodiments, gate dielectric layer 220 is patterned during a different process from patterning gate electrode layer 222.

Figure 2J:
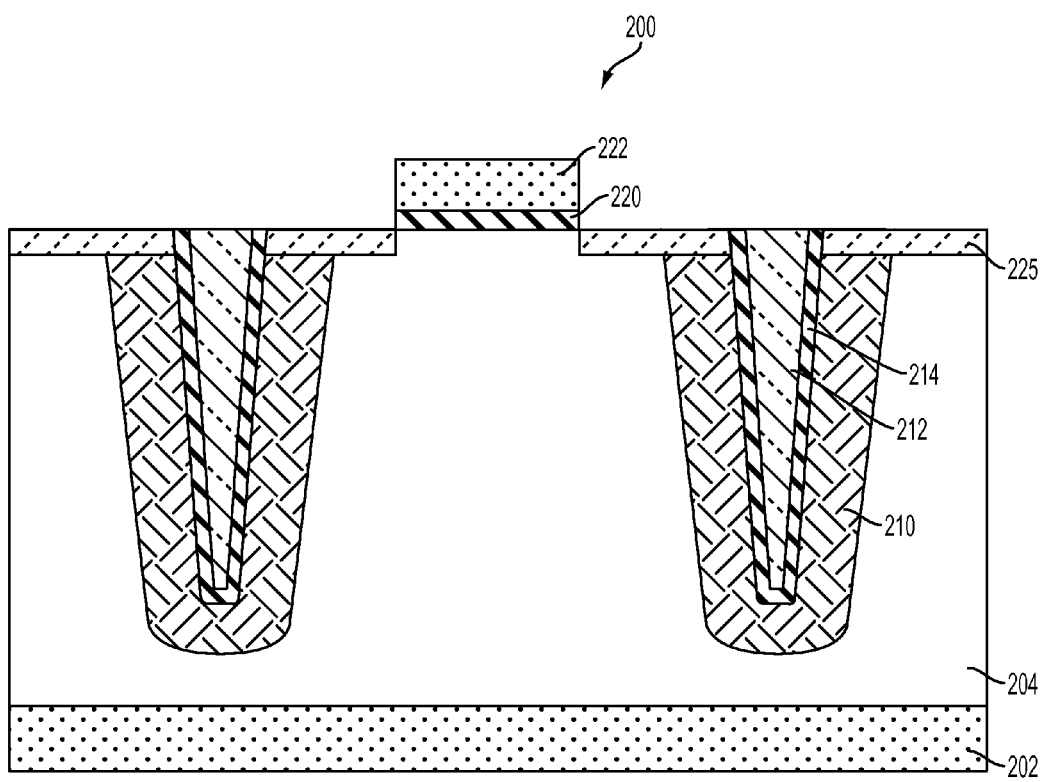

FIG. 2J is a cross sectional view of transistor 200 following formation of a surface implant region 225 in accordance with one or more embodiments. In some embodiments, surface implant region 225 is selectively deposited into epitaxial layer 204 around gate electrode layer 222, fill material 212 and insulating material 214. In some embodiments, surface implant region 225 is formed by masking portions of transistor 200. In some embodiments, masking transistor 200 includes forming and patterning a photoresist material on epitaxial layer 204. In some embodiments, masking transistor 200 includes forming and patterning a hard mask layer on epitaxial layer 204. In some embodiments, surface implant region 225 is formed by an ion implantation process. In some embodiments, the ion implantation process for surface implant region 225 is a same as vertical implantation process 208. In some embodiments, surface implant region 225 includes p-type dopants. In some embodiments, the p-type dopants include boron, boron difluoride or another suitable p-type dopants. In some embodiments, the dopant in surface implant region 225 is a same dopant as doped body 210. In some embodiments, the dopant in surface implant region 225 is different from doped body 210. In some embodiments, a dopant concentration of surface implant region 225 ranges from about $10^{15}$ ions/cm$^3$ to about $10^{18}$ ions/cm$^3$. In some embodiments, the dopant concentration of surface implant region 225 is a same as the dopant concentration of dopants 209 used to form doped body 210. In some embodiments, the dopant concentration of surface implant region 225 is different from the dopant concentration of dopants 209 used to form doped body 210.

Figure 2K:
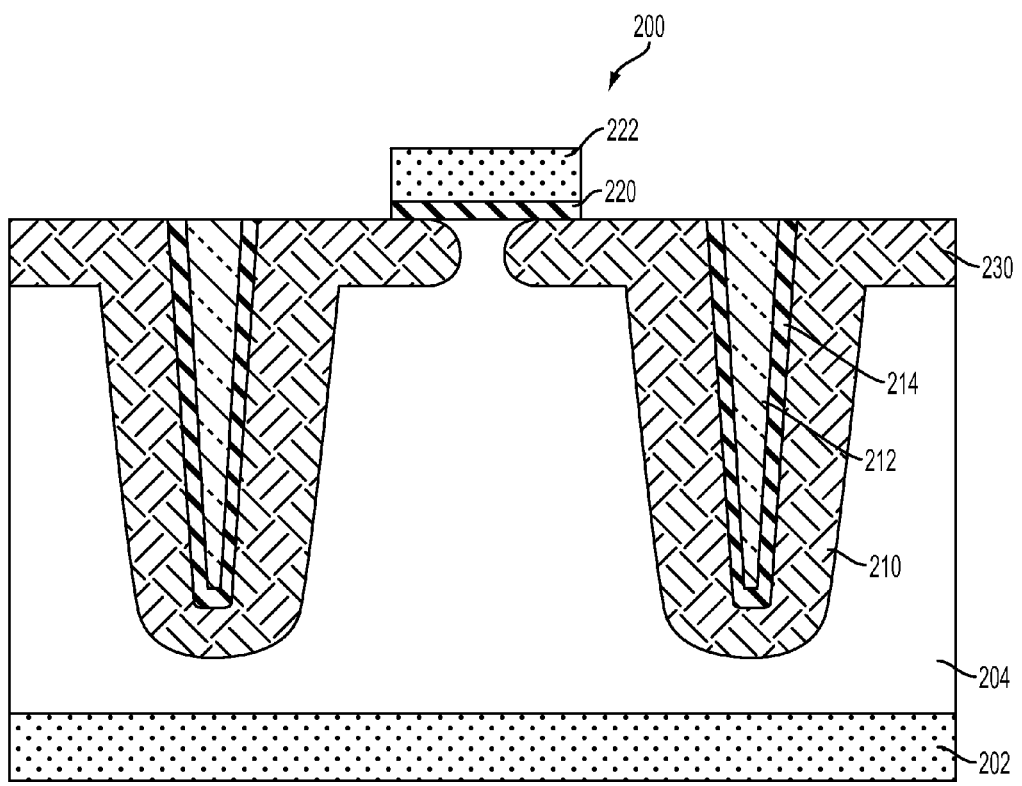

FIG. 2K is a cross sectional view of transistor 200 following a second thermal process in accordance with one or more embodiments. The second thermal process diffuses surface implant region 225 into epitaxial layer 204 to form surface doped region 230. In some embodiments, the second thermal process is an anneal process. In some embodiments, the second thermal process includes heating transistor 200 in an environment having a temperature ranging from about 1000° C. to about 1200° C. In some embodiments, a duration of the second thermal process ranges from about 30 minutes to about 200 minutes. In some embodiments, the second thermal process is performed in an inert environment. In some embodiments, the second thermal process is performed in an environment including a reducing agent. In some embodiments, the second thermal process is a same process as the first thermal process. In some embodiments, the second thermal process is different from the second thermal process. In some embodiments, the second thermal process forms surface doped region 230 which is uniform with doped body 210.

Figure 2L:
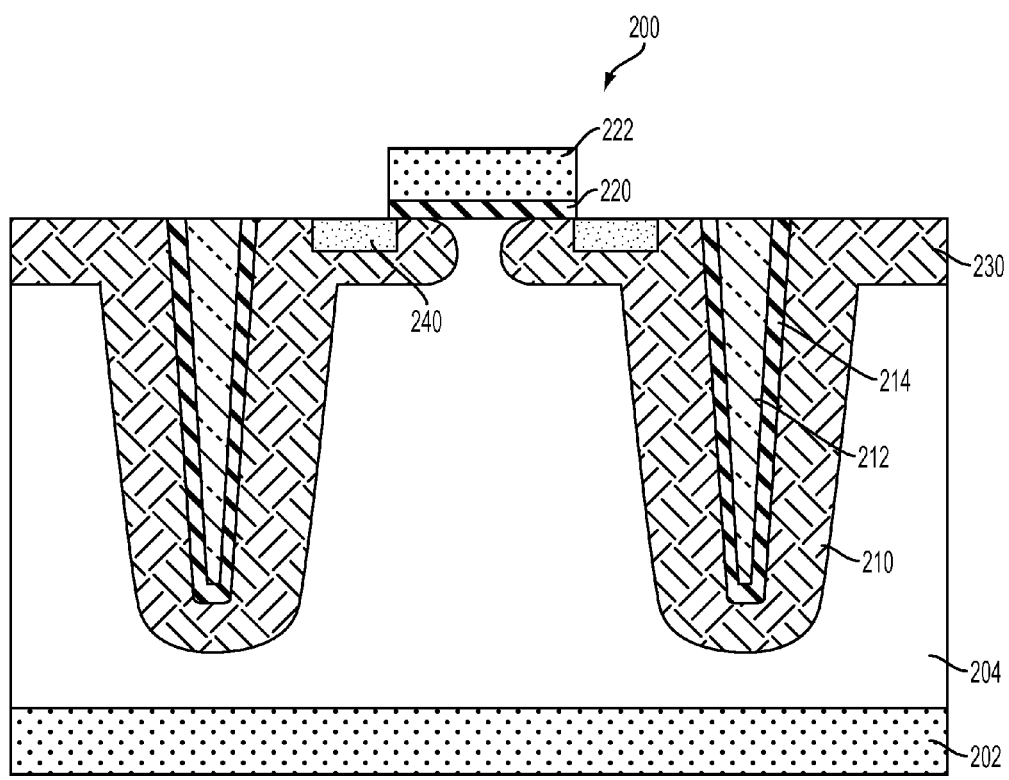

FIG. 2L is a cross sectional view of transistor 200 following formation of first heavily doped region 240 in accordance with one or more embodiments. In some embodiments, first heavily doped region 240 is formed by an ion implantation process. In some embodiments, the ion implantation process is combined with a masking process. In some embodiments, the masking process includes a patterned photoresist material over epitaxial layer 204. In some embodiments, the masking process includes a patterned hard mask layer over epitaxial layer 204. In some embodiments, first heavily doped region 240 has a dopant concentration ranging from about $10^{18}$ ions/cm$^3$ to about $10^{20}$ ions/cm$^3$. In some embodiments, first heavily doped region 240 includes n-type dopants. In some embodiments, the n-type dopants include arsenic, phosphorous or another suitable n-type dopants. In some embodiments, a dopant in first heavily doped region 240 is a same dopant as in epitaxial layer 204. In some embodiments, the dopant in first heavily doped region 240 is a different dopant from the dopant in epitaxial layer 204.

In some embodiments, forming first heavily doped region 240 includes a third thermal process. The third thermal process is used to diffuse dopants of first heavily doped region 240 in surface doped region 230. In some embodiments, the third thermal process is an anneal process. In some embodiments, the third thermal process includes heating transistor 200 in an environment having a temperature ranging from about 850° C. to about 950° C. In some embodiments, a duration of the third thermal process ranges from about 30 minutes to about 60 minutes. In some embodiments, the third thermal process is performed in an inert environment. In some embodiments, the third thermal process is performed in an environment including a reducing agent.

Figure 2M:
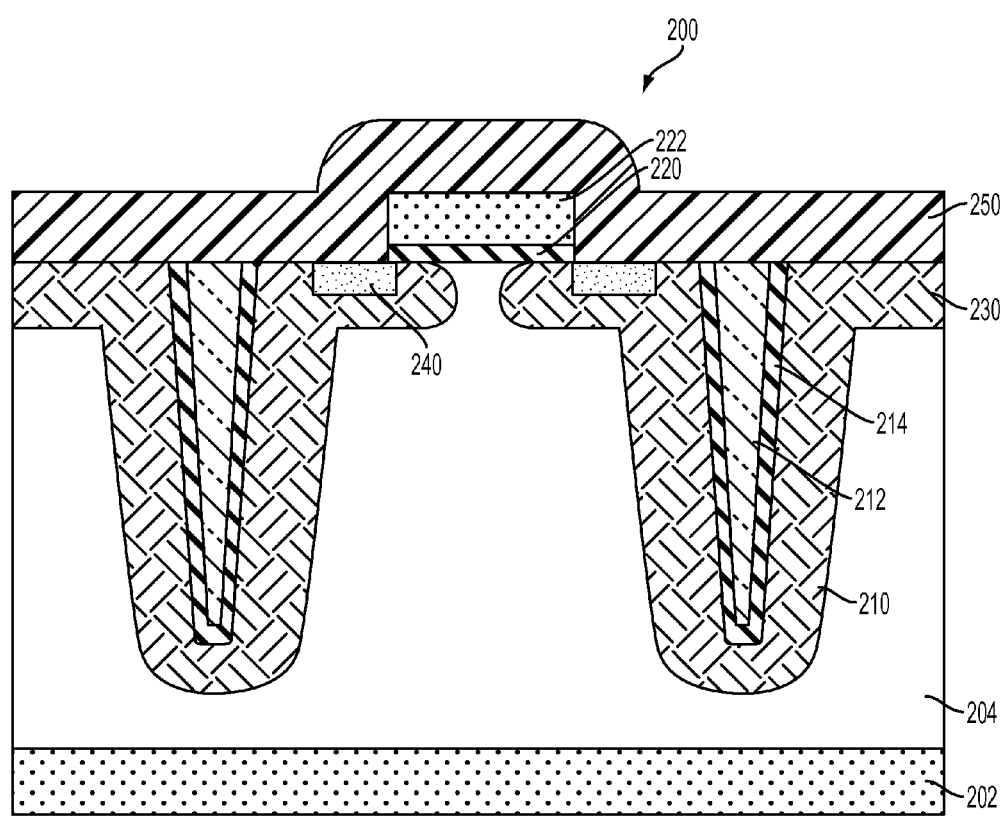

FIG. 2M is a cross sectional view of transistor 200 following formation of ILD 250 in accordance with one or more embodiments. ILD 250 is formed over gate electrode layer 222. In some embodiments, ILD 250 is formed using a CVD process, a PVD process, a spin-on process or another suitable formation process.

Figure 2N:
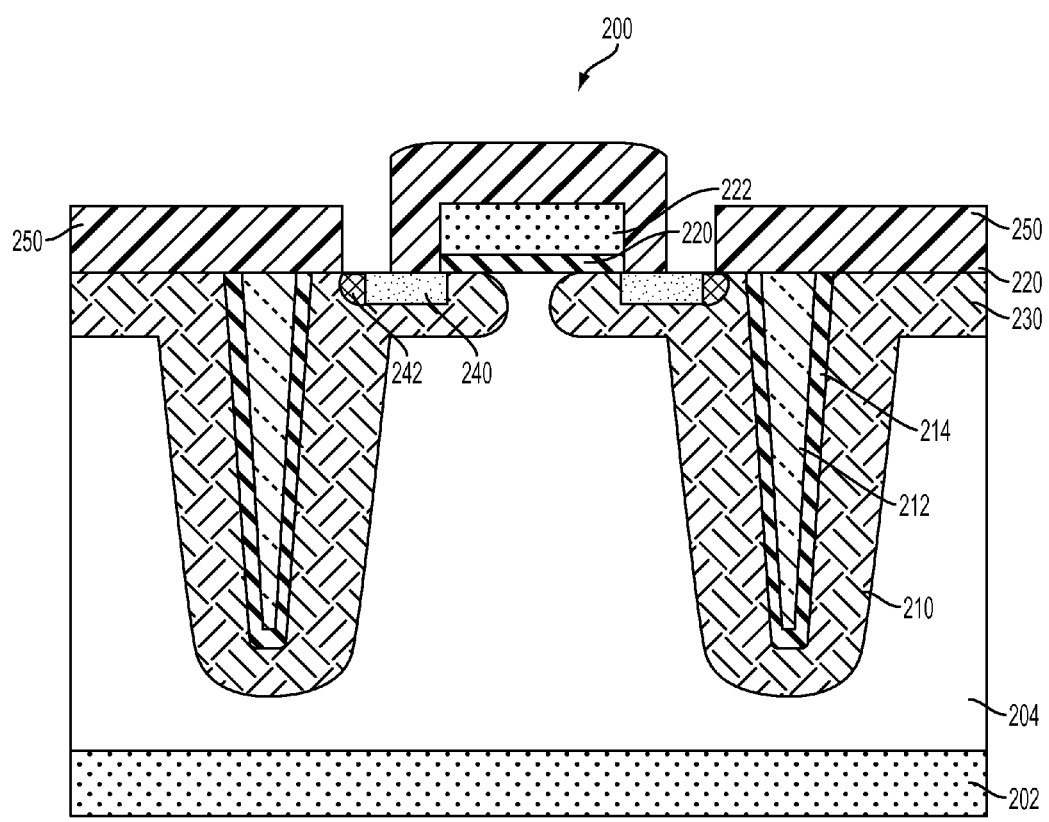

FIG. 2N is a cross sectional view of transistor 200 following patterning of ILD 250 and formation of second heavily doped region 242 in accordance with one or more embodiments. ILD 250 is patterned to expose a portion of surface doped region 230. In some embodiments, ILD 250 is patterned using a photolithography/etching process, a laser drilling process or another suitable material removal process.

Second heavily doped region 242 is formed in contact with first heavily doped region 240. In some embodiments, second heavily doped region 242 is formed by an ion implantation process. In some embodiments, second heavily doped region 242 includes p-type dopants. In some embodiments, the p-type dopants include boron, boron difluoride or other suitable p-type dopants. In some embodiments, the dopants in second heavily doped region 242 are the same as in doped body 210 or surface doped region 230. In some embodiments, dopants in second heavily doped region 242 are different from doped body 210 or surface doped region 230. In some embodiments, a dopant concentration of second heavily doped region ranges from about $10^{17}$ ions/cm$^3$ to about $10^{19}$ ions/cm$^3$. The dopant concentration of second heavily doped region 242 is greater than a dopant concentration of surface doped region 230 and doped body 210. In some embodiments, a fourth thermal process is performed to help diffuse dopants into surface doped region 230. In some embodiments, the fourth thermal process is a rapid thermal anneal, a rapid thermal process or another suitable thermal process. In some embodiments, the fourth thermal process is the same as the third thermal process. In some embodiments, the fourth thermal process is different from the third thermal process.

Following formation of second heavily doped region 242, a conductive layer, e.g., conductive layer 160 (FIG. 1), is formed over ILD 250 and electrically connects to second heavily doped region 242. Following formation of the conductive layer, transistor 200 resembles transistor 100. In some embodiments, the conductive layer is formed by a PVD process, a sputtering process, an ALD process, a plating process, or another suitable formation process. In some embodiments, the conductive layer is blanket deposited and then patterned to expose portions of ILD 250. In some embodiments, the patterning process includes etching the conductive layer or another suitable material removal process.

One aspect of this description relates to a super junction including a substrate, and an epitaxial layer over the substrate, the epitaxial layer having a first dopant type. The super junction further includes an angled trench in the epitaxial layer, the angled trench having sidewalls disposed at an angle ranging from about 85-degrees to about 89-degrees with respect to a top surface of the epitaxial layer. The super junction further includes a doped body in the epitaxial layer surrounding the angled trench, the doped body having a second dopant type, opposite that of the first dopant type.

Another aspect of this description relates to a transistor including a substrate, and a super junction over the substrate. The super junction includes an epitaxial layer over the substrate, the epitaxial layer having a first dopant type. The super junction further includes an angled trench in the epitaxial layer, the angled trench having sidewalls disposed at an angle ranging from about 85-degrees to about 89-degrees with respect to a top surface of the epitaxial layer. The super junction further includes a doped body in the epitaxial layer surrounding the angled trench, the doped body having a second dopant type, opposite that of the first dopant type. The transistor further includes a gate structure over the super junction. The gate structure includes a gate dielectric layer over the epitaxial layer, and a gate electrode layer over the gate dielectric layer.

Still another aspect of this description relates to a method of making a super junction. The method includes forming an epitaxial layer over a substrate, the epitaxial layer having a first dopant type. The method further includes forming an angled trench in the epitaxial layer, the angled trench having sidewalls disposed at an angle ranging from about 85-degrees to about 89-degrees with respect to a top surface of the epitaxial layer. The method further includes forming a doped body in the epitaxial layer surrounding the angled trench, the doped body having a second dopant type, opposite that of the first dopant type.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A super junction comprising:
   an epitaxial layer having a first dopant type;
   an angled trench in an upper portion of the epitaxial layer, the angled trench having sidewalls disposed in a residual portion of the epitaxial layer at an angle ranging from about 85-degrees to about 89-degrees with respect to a top surface of the epitaxial layer and a bottom surface disposed parallel to the top surface;
   a first layer of a first material along the bottom surface and along the sidewalls of the angled trench and defining a first opening, the first material being an insulating material;
   a second layer of a second material in the first opening, the second material being different from the first material;
   a doped body having a second dopant type in the residual portion of the epitaxial layer and surrounding the bottom surface and sidewalls of the angled trench, the second dopant type being opposite that of the first dopant type, wherein the doped body has a substantially uniform thickness extending into the residual portion of the epitaxial layer from the sidewalls of the angled trench;
   a gate electrode formed over the residual portion of the epitaxial layer;
   a surface doped region of the second dopant type in the residual portion of the epitaxial layer, continuous with the doped body, and below a lower surface of the gate electrode;
   an interlayer dielectric (ILD) over the gate electrode; and
   a conductive layer over the ILD, wherein the conductive layer electrically contacts the surface doped region, and the conductive layer is separated from the second layer.

2. The super junction of claim 1, wherein the second material is a dielectric.

3. The super junction of claim 2, wherein the second material comprises a conductive material.

4. The super junction of claim 2, wherein the second material is air.

5. The super junction of claim 2, wherein the second material is silicon oxide or silicon nitride.

6. The super junction of claim 1, wherein the first dopant type is an n-type dopant, and the second dopant type is a p-type dopant.

7. The super junction of claim 1, wherein a dopant concentration of the doped body ranges from about $10^{15}$ ions/cm$^3$ to about $10^{18}$ ions/cm$^3$.

8. A transistor comprising:
   a super junction, wherein the super junction comprises:
   an epitaxial layer having a first dopant type,
   an angled trench confined to the epitaxial layer, the angled trench having sidewalls disposed in a residual portion of the epitaxial layer at an angle ranging from about 85-degrees to about 89-degrees with respect to a top surface of the epitaxial layer and a bottom surface disposed parallel to the top surface;
   a first conformal layer of insulating material in direct contact with an entirely of the bottom surface and the sidewalls of the angled trench, the first conformal layer defining an opening within the trench, a second layer of material filling the opening, the second layer of material having a composition different from the insulating material, a doped body in the epitaxial layer having a second dopant type, the second dopant type being opposite that of the first dopant type, wherein a top surface of the doped body is coplanar with a top surface of the epitaxial layer, the doped body has a first thickness extending into the epitaxial layer from a first portion of the sidewalls of the angled trench near the top surface of the epitaxial layer and a second thickness extending into the epitaxial layer from a second portion of the sidewalls of the angled trench near the bottom surface of the angled trench, wherein the first thickness and the second thickness are equal;

a gate structure over the super junction, wherein the gate structure is displaced from the super junction in a direction parallel to a top surface of the epitaxial layer, and the gate structure comprising:

a gate dielectric layer over the epitaxial layer, and a gate electrode layer over the gate dielectric layer;

an interlayer dielectric (ILD) over the gate electrode; and a conductive layer over the ILD, the conductive layer electrically contacting a surface region of the epitaxial layer, and the conductive layer is separated from the second layer.

9. The transistor of claim 8, further comprising a surface doped region in the surface region of the epitaxial layer, the surface doped region comprising the second dopant type.

10. The transistor of claim 9, wherein the surface doped region is continuous with the doped body.

11. The transistor of claim 10, further comprising a first heavily doped region in the surface doped region, the first heavily doped region comprising the first dopant type, wherein a dopant concentration of the first heavily doped region is greater than a dopant concentration of the epitaxial layer.

12. The transistor of claim 11, further comprising a second heavily doped region in the surface doped region between the first heavily doped region and the trench, the second heavily doped region comprising the second dopant type wherein the conductive layer directly contacts both the first heavily doped region and the second heavily doped region.

13. The transistor of claim 12, wherein the first heavily doped region is in direct contact with the second heavily doped region.

14. The transistor of claim 11, further comprising a conductive layer configured to electrically connect to the first heavily doped region, wherein the conductive layer is over the gate electrode layer.

15. The transistor of claim 14, further comprising an inter-layer dielectric (ILD) over the epitaxial layer and the gate electrode layer, wherein the ILD is between the gate electrode layer and the conductive layer.

16. A method of making a super junction, the method comprising:

forming an epitaxial layer over a substrate, the epitaxial layer having a first dopant type;

removing a portion of the epitaxial layer to form an angled trench in a residual portion of the epitaxial layer, the angled trench having sidewalls disposed at an angle ranging from about 85-degrees to about 89-degrees with respect to a top surface of the epitaxial layer and a bottom surface substantially parallel to the top surface of the epitaxial layer;

depositing dopant atoms in the residual portion of the epitaxial layer adjacent the sidewalls and bottom surface of the angled trench to form a doped body surrounding the angled trench, the doped body having a second dopant type, the second dopant type being opposite that of the first dopant type, wherein the doped body extends to a top surface of the residual portion of the epitaxial layer, the doped body has a first thickness measured from an upper sidewall region of the angled trench and a second thickness measured from a lower sidewall region of the angled trench, the first thickness and second thickness being equal;

forming an insulating layer on an entirely of the bottom surface and the sidewalls of the angled trench to define a first opening within the trench;

forming a fill layer on the insulating layer in the first opening, the fill layer being different than the insulating layer;

depositing dopant atoms in a surface portion of the residual portion of the epitaxial layer to form a surface doped region extending from and continuous with an upper portion of the doped body, the surface doped region having the second dopant type;

forming a gate electrode wherein a lower surface of the gate electrode is above both a first plane defined by an upper surface of the surface doped region;

forming an interlayer dielectric (ILD) over the gate electrode; and forming a conductive layer over the ILD, the conductive layer electrically contacting the surface doped region, and second conductive layer is separated from the second layer.

17. The method of claim 16, wherein depositing dopant atoms to form the doped body comprises performing a vertical ion implantation into the angled trench.

18. The method of claim 17, wherein forming the doped body further comprises performing a thermal process to diffuse dopant atoms implanted by the vertical ion implantation farther into the epitaxial layer.

19. The method of claim 17, wherein performing the vertical ion implantation comprises implanting a dopant concentration ranging from about $10^{15}$ ions/cm$^3$ to about $10^{18}$ ions/cm$^3$.

20. The method of claim 16, wherein the fill layer is a conductive material.

* * * * *